United States Patent [19]

Sechi et al.

[11] 4,189,688
[45] Feb. 19, 1980

[54] MICROWAVE FET POWER OSCILLATOR

[75] Inventors: Franco N. Sechi, Lawrenceville; Raymond L. Camisa, East Windsor, both of N.J.

[73] Assignee: RCA Corporation, New York, N.Y.

[21] Appl. No.: 927,625

[22] Filed: Jul. 24, 1978

[51] Int. Cl.[2] .......................... H03B 5/08; H03B 7/06
[52] U.S. Cl. .............................. 331/117 FE; 331/99; 331/115; 331/177 V
[58] Field of Search ................. 331/117 R, 117 D, 96, 331/99, 101, 168, 177 V, 115, 117 FE

[56] References Cited

U.S. PATENT DOCUMENTS

| | | | |
|---|---|---|---|
| 3,421,111 | 1/1969 | Boyajian | 331/177 V |
| 3,516,021 | 6/1970 | Kohn | 331/117 D |
| 4,135,168 | 1/1979 | Wade | 331/108 R |

OTHER PUBLICATIONS

Abe et al., "A High-Power Microwave GaAs FET Oscillator", NEC Research and Development, No. 45, Apr. 1977, p. 58.
Wade, "X-Band Reverse Channel GaAs FET Power VCO", Microwave Journal, vol. 21, No. 4, Apr. 1978, p. 72.
Huang et al., "Thermal Resistance of GaAs Power FETs", Proceedings of the Sixth Biennial Cornell Electrical Engineering Conference, 1977, p. 297.

Primary Examiner—Siegfried H. Grimm
Assistant Examiner—Edward P. Westin
Attorney, Agent, or Firm—Samuel Cohen; Joseph D. Lazar; Raymond E. Smiley

[57] ABSTRACT

First and second field effect transistors (FETs) each have a gallium arsenide substrate with an N-type active region that carries first and second electrodes in ohmic contact therewith and a gate electrode. The FETs are mounted in a flip-chip carrier that connects the first electrodes to ground. The FETs are biased to cause a current to flow from the first to second electrodes, whereby the first and second electrodes serve as drains and sources, respectively, of the FETs. The gate of the first FET is connected to a resonator. Additionally, a matching network connects the source of the first FET to the gate of the second FET. The matching network and the biasing of the first FET cause the gate input impedance thereof to be of a negative value that compensates for losses in the resonator. A load connected to the source of the second FET and the bias voltage cause the second FET to have a gate input impedance of a negative value that causes oscillation.

3 Claims, 4 Drawing Figures

MICROWAVE FET POWER OSCILLATOR

CROSS REFERENCE TO COPENDING APPLICATIONS

Of interest are the following commonly assigned pending U.S. patent applications: U.S. patent application Ser. No. 927,624, filed on even date herewith, entitled, "Microwave FET Power Oscillator" by Raymond L. Camisa; and U.S. patent application Ser. No. 927,626, filed on even date herewith, entitled, "Microwave FET Power Circuit" by Franco N. Sechi.

BACKGROUND OF THE INVENTION

1. Field of Invention

This invention relates to circuits that operate at microwave frequencies and more particularly to an oscillator circuit.

2. Description of the Prior Art

An oscillatory tendency of a field effect transistor (FET) is typically expressed in terms of Rollet's stability factor (k). See J. M. Rollet "Stability and Power-Gain Invariants of Linear Two-Ports", IRE Transactions on Circuit Theory, Vol. CT 9, pp. 29–32, March, 1962. When the stability factor is greater than unity, the FET is unconditionally stable. An FET operated in a common source circuit configuration, for example, usually has a stability factor greater than unity.

When the stability factor is less than unity, the FET is potentially unstable. Because of the potential unstability, a combination of a load impedance and a source impedance of the FET can be selected to induce oscillation. When the FET tends to oscillate at microwave frequencies, it is suitable for use in an oscillator circuit.

The FET inherently dissipates power in direct relation to power delivered to a load. Hence, the power delivered by the oscillator is limited by the amount of power the FET can safely dissipate.

The FET typically has a gallium arsenide substrate with an N-type active region. As known to those skilled in the art, gallium arsenide has a high thermal resistance compared with the thermal resistance of a typical metal heat sink. Because of the high thermal resistance, it is difficult to conduct heat through the substrate to a heat sink. Therefore the thermal resistance of the substrate limits the power that the FET can safely dissipate.

Increased amounts of heat are conducted from the substrate by either making the substrate as thin as practical and plating it with metal or providing an increased spatial separation between elements of the FET. However, either plating the thin substrate or increasing the spatial separation of the elements increases the complexity of construction of the FET.

Alternatively, the heat may be conducted from the surface of the substrate where the heat is generated by mounting the FET in a type of heat sink known as a flip-chip carrier. The flip-chip carrier is referred to and shown in the article, "Thermal Resistance of GaAs Power FETs" by H. C. Huang, F. N. Sechi and L. S. Napoli in the Proceedings of the Sixth Biennial Cornell Electrical Engineering Conference (1977). To understand the mounting in the carrier, it should be understood that the FET is comprised of a plurality of unit transistors with the substrate common to all of the unit transistors.

An exemplary unit transistor includes three elements, one of which is a thin metal deposition, known as a unit gate, that forms a Schottky barrier junction with the substrate. The other two elements are each a thin metal deposition in ohmic contact with the substrate. The other two elements are known as a unit drain and a unit source, respectively. Typically the gate is symmetrically located with respect to the inner edges of the ohmic contact elements.

The total area on the substrate utilized by the unit sources is greater than the area utilized by either the unit gates or the unit drains. Therefore, the heat is most effectively conducted from the substrate when it is connected to the carrier through the unit sources. The connection to the carrier preferably does not include a wire lead, since the lead may introduce an undesired inductance.

The unit sources are easily connected to the carrier when they have a layer of metal plating, thereby providing plated unit sources with surfaces that have a displacement from the substrate greater than the displacements of the surfaces of the unit gates and the unit drains. The FET is mounted with the surfaces of the plated unit sources in contact with a flat surface of the carrier. Because the surfaces of the plated unit sources have a greater displacement from the substrate than the surfaces of the unit gates and unit drains, the flat surface does not make contact with either the unit gates or the unit drains. The carrier is typically connected to a ground plane, whereby all of the unit sources form a grounded source electrode of the FET.

Usually, all of the unit drains are connected together by a metal deposition on the substrate. Additionally, all of the unit gates are connected together by a metal deposition on the substrate. However, the unit sources are not connected together by a metal deposition; they are only connected together through the carrier. Because the substrate has the N-type active region, the unit gates and unit drains are biased negative and positive, respectively, relative to ground, to cause a bias current to flow from the unit drains to the unit sources. The unit gates, unit drains and unit sources are referred to as a gate electrode, a drain electrode and a source electrode, respectively.

When the FET is mounted in the carrier, it is particularly suited for use in a common source circuit configuration because the unit sources form the grounded electrode. When the FET is in the common source configuration and has a stability factor greater than unity, the FET is not suitable for use in an oscillator. However, an oscillator circuit where an FET is mounted in a flip-chip carrier is described in the Technical Note, "X-Band Reverse Channel GaAs FET Power VCO" by Paul C. Wade in Volume 21, No. 4, April, 1978 issued of Microwave Journal, page 92.

Harmonic and noise content of a signal provided by an oscillator is inversely related to the Q of a resonator portion of the oscillator. The resonator often includes a varactor that is operable to change the resonant frequency of the oscillator. Typically, the varactor is lossy and thereby lowers the Q of the resonator.

Heretofore, easily constructed power oscillators that utilize a field effect transistor mounted in a flip-chip carrier have not been known in the prior art. Additionally, the instability of the field effect transistor has never been utilized to increase the Q of a resonator included in an oscillator.

SUMMARY OF THE INVENTION

According to the present invention, unit sources of a first transistor are connected to ground through a heat sink to serve as a grounded drain. A first bias voltage is applied to the unit drains of the first transistor to provide a reversed bias source, whereby the first transistor is connected in a common drain circuit configuration. A resonator is connected to the gate electrode of the first transistor. The first bias voltage and an impedance connected to the source of the first transistor causes the gate input impedance thereof to have a negative value such that the impedance, the first transistor and the resonator form a composite network having a Q in excess of the Q of the resonator. Unit sources of a second field effect transistor are connected to ground through the heat sink to serve as a grounded drain. A second bias voltage is applied to the unit drains of the second transistor to provide a reversed bias source, whereby the second transistor is connected in a common drain circuit configuration. A load including network means is connected to the source of said second transistor causing the gate input impedance of the second resistor to be negative such that the load and second transistor oscillate.

DESCRIPTION OF THE PREFERRED EMBODIMENT

Figure 1:
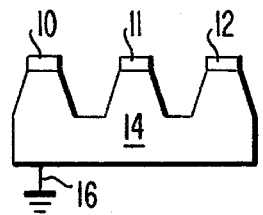
FIG. 1 is a side elevation of structural elements of the preferred embodiment of the present invention.
Figure 2:
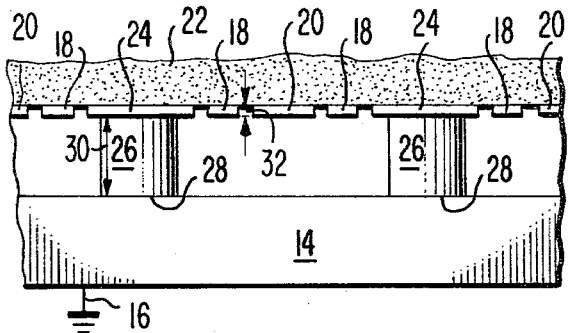
FIG. 2 is a view of FIG. 1 that shows details of the connection between elements thereof.

As shown in FIGS. 1 and 2, similar field effect transistors (FETs) 10, 11 and 12 are all mounted, as explained hereinafter, on an electrically conductive heat sink 14 (FIG. 1) which is connected to a ground 16. Exemplary of FETs 10–12, FET 10 has a plurality of unit gates 18 (FIG. 2) and a plurality of unit drains 20 carried on a gallium arsenide substrate 22 having an N-type active region. Unit gates 18 each form a Schottky barrier junction with substrate 22. Additionally, unit gates 18 are connected to each other by a metal deposition (not shown) on substrate 22.

Unlike unit gates 18, unit drains 20 are in ohmic contact with substrate 22. However, similar to unit gates 18, unit drains 20 are connected together by a metal deposition (not shown) on substrate 22.

Substrate 22 additionally carries a plurality of unit sources 24. Similar to unit drains 20, unit sources 24 are in ohmic contact with substrate 22.

Unit sources 24 are all plated with gold that forms posts 26. Surfaces 28 of posts 26 have a displacement 30 from substrate 22. The remote surfaces of both unit gates 18 and unit drains 20 have a displacement 32 from substrate 22. Displacement 30 is much larger than displacement 32.

Surfaces 28 are in an abutting relationship with heat sink 14 whereby substrate 22 is connected to heat sink 14 through unit sources 24 and posts 26. The abutting relationship is maintained in any suitable manner. Since heat sink 14 is electrically conductive, the abutting relationship electrically connects together all of unit sources 24.

Because displacement 30 is larger than displacement 32, unit gates 18 and unit drains 20 do not contact heat sink 14. FETs 11 and 12 are connected to heat sink 14 in a manner similar to that described in the above prior art section.

Figure 3:
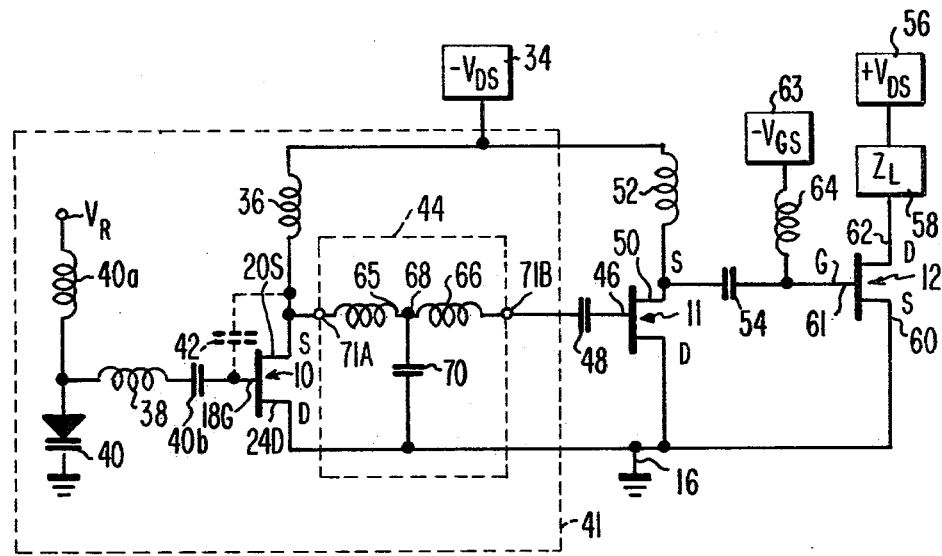
FIG. 3 is a schematic diagram of the preferred embodiment of the present invention.

As shown in FIG. 3, unit drains 20 are connected to a negative bias voltage supply 34 ($-V_{DS}$) through an RF choke 36. Choke 36 has a high impedance to signals in the radio frequency spectrum, thereby preventing supply 34 from absorbing a signal provided by unit drains 20. Although gate electrode 18G of FET 10 is not connected to a bias voltage supply, it should be understood that a contact potential is established at gate 18G whereby gate 18G is biased more negative than unit drains 20.

Since substrate 22 (FIG. 2) has an N-type active region, supply 34 provides a bias voltage that causes unit sources 24 and unit drains 20 to be a drain electrode 24D and a source electrode 20S, respectively, whereby FET 10 is connected in a common drain circuit configuration. It should be understood that the gate to source interelectrode capacitance of a field effect transistor is higher than all other interelectrode capacitances of the transistor.

Because of its common drain circuit configuration, FET 10 may be operated with a gate input impedance which is negative. As explained hereinafter, FET 10 has a negative gate input impedance that is utilized with a resonator to form a network having a higher Q than the Q of the resonator.

Gate electrode 18G is connected through a series combination of an inductor 38 and a varactor 40 to ground 16. Inductor 38 and varactor 40 form a resonator. The resonator and the gate to source interelectrode capacitor 42 of FET 10 resonates at a desired frequency of oscillation.

As known to those skilled in the art, a varactor is a diode that provides a capacitance that varies with an applied voltage. It should be understood that varactor 40 provides a desired capacitance in response to a predetermined voltage provided by a voltage supply (not shown). Thus, for a varactor, a voltage source $V_R$ is coupled to the varactor 40 via an inductor 40a, an isolating capacitor 40b, isolating the gate from the voltage $V_R$.

Source electrode 20S is additionally connected to a matching network 44, which is described hereinafter. Network 44 and the voltage provided by supply 34 cause the gate to drain impedance of FET 10 to be negative and of a value that compensates for losses in varactor 40. Because the gate to drain input impedance of FET 10 compensates for the losses, FET 10, inductor 38 and varactor 40 form a composite network 41 having a Q higher that the Q of the resonator.

Source electrode 20S is coupled to the gate electrode 46 of FET 11 through matching network 44 and a blocking capacitor 48. Capacitor 48 has a negligible impedance to signals in the radio frequency spectrum.

The source electrode 50 of FET 11 is coupled to supply 34 through an RF choke 52 which is similar to choke 36. For reasons given hereinbefore in connection with the description of FET 10, FET 11 is also connected in a common drain circuit configuration. Source 50 is additionally coupled to the gate electrode 52 of FET 12 through a blocking capacitor 54, which is similar to capacitor 48.

The unit drains of FET 12 (not shown) are connected to a positive voltage supply 56 ($+V_{DS}$) through a load impedance ($Z_L$) 58. Supply 56 causes a bias current to flow from the unit sources to the unit drains of FET 12 whch thereby form a source electrode 60 and a drain electrode 62, respectively. Accordingly, FET 12 is connected in a conventional common source circuit.

Gate electrode 61 is connected to a negative bias voltage supply 63 ($-V_{GS}$) through an RF choke 64 which is similar to choke 36. Supply 63 biases FET 12 to provide for a maximum transfer of undistorted power from FET 12 to load 58.

The load on FET 11 substantially equals the gate input impedance of FET 12. Since FET 12 is connected in the common source circuit configuration, the gate input impedance of FET 12 is positive. In this embodiment, when the desired frequency of oscillation is in the four to 12 gigahertz range, the gate input impedance of FET 12 is on the order of 200 ohms. The gate input impedance of FET 12 and the bias voltage provided by supply 34 cause the gate input impedance of FET 11 to be negative whereby FET 11 and the composite circuit 41 form an oscillator that oscillates at the desired frequency of oscillation. The output of the oscillator is provided to load 58 by FET 12.

Matching network 44, referred to hereinbefore (FIG. 3), is schematically shown as including series connected inductors 65 and 66 that couple FET 10 to FET 11 via capacitor 48. A junction 68 of inductors 65 and 66 is connected to ground through a capacitor 70.

As known to those skilled in the art, there is a maximum transfer of power from FET 10 to network 44 when the impedance of network 44 at an input port 71A is the complex conjugate of the output impedance of FET 10 at electrode 20S. A maximum of the power is transferred from network 44 to FET 11 when the impedance of network 44 at an output port 71B is the complex conjugate of the gate input impedance of FET 11. Matching networks are well known in the art.

Transistor 12 in a conventional grounded source configuration, serves as an amplifier which isolates the load impedance 58 from the transistor 11 whereby any variations in the impedance of the load is isolated from the oscillator transistor 11.

Figure 4:
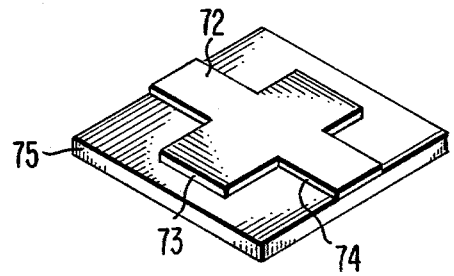
FIG. 4 is a microstrip transmission line included in the embodiment of FIG. 3.

As shown in FIG. 4, network 44 is typically constructed from microstrip transmission lines 72, 73 and 74 disposed upon a substrate 75. Lines 72–74 all have axial lengths of one eighth of a wavelength associated with the desired frequency of oscillation. The dimensions of lines 72 and 74 are selected to have a high impedance relative to transmission line 73. Accordingly, transmission lines 72 and 74 are narrower than transmission line 73.

What is claimed is:

1. In an oscillator circuit wherein first and second field effect transistors each have pluralities of unit sources, unit drains and unit gates disposed upon a semiconductor substrate, a heat sink connecting said unit sources to ground, the improvement comprising:

means for applying a bias voltage to said first and second transistors for causing a higher interelectrode capacitance between respective unit gates and unit drains thereof than between respective unit gates and unit sources thereof, said unit gates, unit drains and unit sources of said first transistor and second transistor serving as gate, source and drain electrodes, respectively;

a resonator connected between the gate electrode of said first transistor and the respective drain electrodes of said first and second transistors;

coupling means for coupling the source electrode of said first transistor to the gate electrode of said second transistor, said coupling means and said bias voltage causing the gate input impedance of said first transistor to be of a negative value, said resonator, said first transistor and said coupling means forming a composite network with a Q higher than the Q of said resonator; and load means connected to the source electrode of said second transistor, said load means and said bias voltage causing the gate input impedance of said second transistor to be of a negative value such that said load means, said composite network and said second transistor oscillate.

2. The oscillator circuit of claim 1 wherein said load means comprises:

a third field effect transistor having pluralities of unit sources, unit drains and unit gates disposed upon a semiconductor substrate, the unit sources of said third transistor being connected to a heat sink; and further comprising:

means for applying a bias voltage to said third transistor for causing a higher interelectrode capacitance between unit gates and unit sources thereof than between unit gates and unit drains of said third transistor, unit gates, unit drains and unit sources of said third transistor serving as gate, drain and source electrodes, respectively, said load means being connected to the drain electrode of said third transistor.

3. The oscillator circuit of claim 1 wherein said coupling means includes a microstrip transmission line.

* * * * *